US006730538B1

(12) United States Patent
Meek et al.

(10) Patent No.: US 6,730,538 B1
(45) Date of Patent: May 4, 2004

(54) FABRICATING ELECTRONIC DEVICES USING ACTINIDE OXIDE SEMICONDUCTOR MATERIALS

(75) Inventors: Thomas T. Meek, Knoxville, TN (US); Michael Z. Hu, Knoxville, TN (US)

(73) Assignee: The University of Tennessee Research Corporation, Knoxville, TN (US)

( * ) Notice: Subject to any disclaimer, the term of this patent is extended or adjusted under 35 U.S.C. 154(b) by 0 days.

(21) Appl. No.: 09/599,341

(22) Filed: Jun. 22, 2000

(51) Int. Cl.⁷ .................. H01L 21/00; H01L 21/31
(52) U.S. Cl. .................. 438/104; 438/3; 438/240; 438/778; 438/782; 438/785; 438/758
(58) Field of Search .................. 438/104, 3, 240, 438/778, 782, 785, 758, 754, 701, 98

(56) References Cited

U.S. PATENT DOCUMENTS 4,793,799 A * 12/1988 Goldstein et al. .............. 431/79
5,282,937 A * 2/1994 Miller et al. .................. 205/43
5,503,685 A * 4/1996 Goldstein .................. 136/253
5,900,381 A * 5/1999 Lou et al. .................. 501/54
6,056,865 A * 5/2000 Amamoto et al. .......... 205/353

FOREIGN PATENT DOCUMENTS

| FR | 2061924 | * | 6/1971 | .......... H01M/21/00 |
| FR | 2061924 A | * | 6/1971 | ............ G21D/7/00 |
| GB | 2080268 A | * | 3/1982 | ............ C01G/56/00 |

* cited by examiner

Primary Examiner—Matthew Smith
Assistant Examiner—Igwe U. Anya
(74) Attorney, Agent, or Firm—Duane Morris LLP

(57) ABSTRACT

A method for fabricating electronic devices. First, an actinide oxide semiconductor material is provided. Next, an electronic device is fabricated using the actinide oxide semiconductor material.

13 Claims, 2 Drawing Sheets

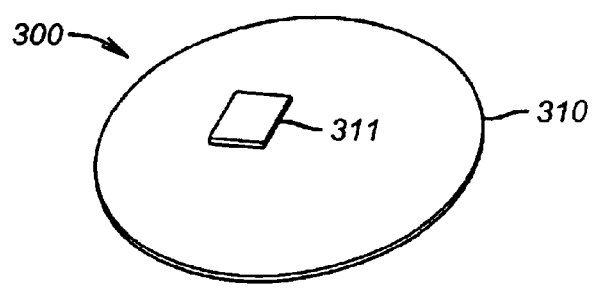
FIG. 3
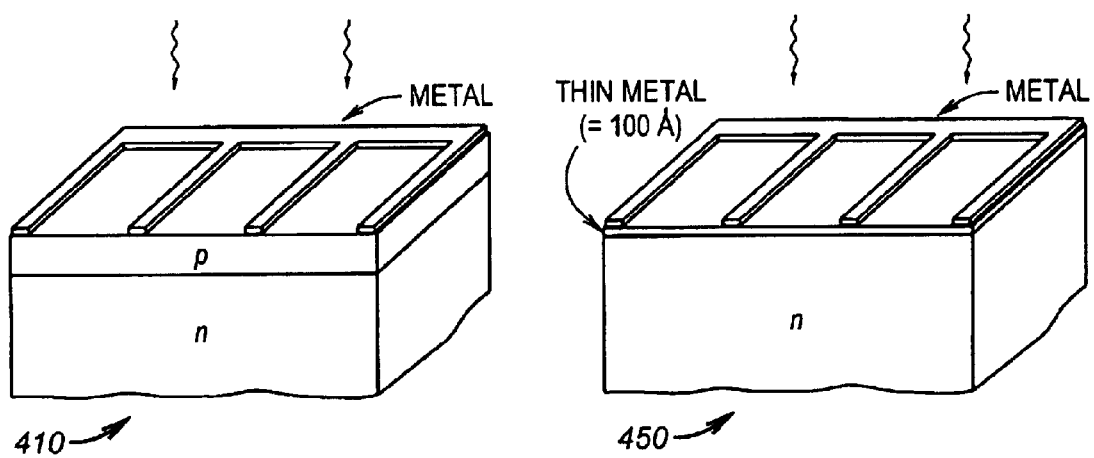
FIG. 4A   FIG. 4B

FABRICATING ELECTRONIC DEVICES USING ACTINIDE OXIDE SEMICONDUCTOR MATERIALS

BACKGROUND OF THE INVENTION

1. Field of the Invention

The present invention relates to the fabrication of semiconductor-based electronic circuits, components, devices, and elements.

2. Description of the Related Art

Semiconductor materials, typically in the form of a wafer, are widely used, primarily to fabricate various useful electronic circuits, components, devices, and elements (referred to herein generally as electronic devices). For example, standard passive and active circuit elements such as transistors, diodes, resistors, capacitors, and conductors may be formed in integrated circuits (ICs) using the semiconductor material wafer as a substrate.

In addition to ICs and components of ICs, other electronic devices may be formed using semiconductor materials, such as thermoelectric devices; photovoltaic devices (solar cells); and optoelectric devices such as light emitting diodes (LED), laser diodes (LD), and photodetectors. Thermoelectric devices can convert temperature differences into a voltage (Seebeck effect), or conversely, generate temperature differences in response to a current (Peltier effect). In such devices, a p-type semiconductor element and an n-type semiconductor element are electrically connected in series. When the two dissimilar elements are subjected to different temperatures, the Seebeck effect causes a voltage to be generated across the junction. A Peltier effect type temperature difference may be generated by applying a current to such a device, e.g. for cooling purposes. The suitability of the materials used for such a thermoelectric device depends primarily on the "figure of merit" parameter. The figure of merit is based on the material type evaluated at the perceived operating temperature of the thermoelectric device. The higher the figure of merit in the temperature range of the thermoelectric device, the better suited the materials are for a thermoelectric device.

Semiconductors may also be used to fabricate photovoltaic devices which produce electrical energy when the semiconductor materials are exposed to visible or IR radiation (light). A typical photovoltaic cell, commonly referred to as a solar cell, is composed of an interface between an n-type semiconductor material and a p-type semiconductor material. A thin transparent layer of n-type or p-type material is deposited on a p-type or n-type material, respectively, to form an active p-n or n-p junction. When the junction is exposed to visible or nearly visible light, in a solar cell application, electron-hole pairs, or minority charge carriers, are created at the junction. These carriers at the n-p interface migrate across the junction in opposite directions, producing an electrical potential or voltage difference. IR photovoltaic devices may also be fabricated, as well as Schottky barrier photovoltaic devices.

Various semiconductor materials are employed for such purposes. Silicon (Si) and Gallium Arsenide (GaAs), for example, are very commonly-used semiconductor materials. Conventional semiconductor materials have various drawbacks. For example, the smallest possible electronic device feature size which can be fabricated using such a substrate may be too large. In addition, semiconductor devices based on Si or GaAs, for example, can withstand temperatures only up to about 200° C., thus limiting or complicating the range of applications. Silicon-based solar cells have a half-life of only about five years in space-based applications, due to silicon's susceptibility to radiation damage. Semiconductor materials with improved properties are therefore desirable.

SUMMARY

In the present invention, there is provided a method for fabricating electronic devices. First, an actinide oxide semiconductor material is provided. Next, an electronic device is fabricated using the actinide oxide semiconductor material.

BRIEF DESCRIPTION OF THE DRAWINGS

FIG. 3 is an exemplary electronic device fabricated from an actinide oxide semiconductor material, according to a preferred embodiment of the present invention; and FIGS. 4A,B illustrate solar cells fabricated using actinide oxide semiconductor materials and having a p-n junction and a Schottky-barrier junction, respectively.

DESCRIPTION OF THE PREFERRED EMBODIMENT

Actinide Oxide Semiconductors

Figure 1:
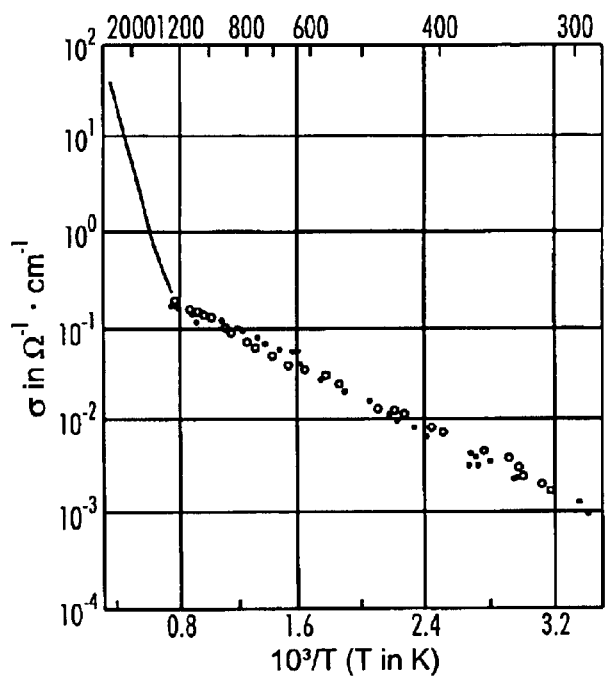
FIG. 1 is a graph of the electrical conductivity of $UO_2$ single crystals as a function of temperature.

In the present invention, certain actinide oxide materials are used to fabricate improved electronic semiconductor devices. The inventors have determined that certain actinide oxides, such as certain oxides of uranium, plutonium, and thorium ($U_xO_y$, $Pu_xO_y$, and $Th_xO_y$), can be semiconductive, i.e. the electronic bandgap (forbidden bandgap) lies within the semiconductor range. Such actinide oxides can be used as semiconductors having properties superior, in many ways, to conventional semiconductor materials. The resulting electronic devices fabricated with actinide oxide semiconductor materials also have various advantages over conventional semiconductor electronic devices.

Another advantage of the present invention is that materials previously considered a liability or waste can be profitably recycled and employed in a productive manner. For example, actinide oxides such as $U_xO_y$, $Pu_xO_y$, and $Th_xO_y$ are typically formed as waste or by-products of various nuclear energy processes (or such wastes can be converted into such actinide oxides). When thorium is used as fuel in nuclear power generation, for example, $ThO_2$ is often produced or left over. When uranium is used as fuel, uranium hexafluoride, e.g. in liquid form, typically results as a by-product; this may be converted to a uranium actinide oxide such as $UO_2$.

Thus, various actinide oxides, in liquid or powder form, often result from sources such as nuclear power production, nuclear weapon programs, and medicine. Actinide oxide materials can also be synthesized from actinide metals such as thorium, uranium, or plutonium, as described in U.S. Pat. No. 5,098,677 (Sauer, et al.), issued Mar. 24, 1992.

As noted above, the inventors have determined that certain actinide oxides have semiconductive properties. These include at least $UO_2$, $PuO_2$, and $ThO_2$, as well as other actinide oxides of the form $U_xO_y$, $Pu_xO_y$, and $Th_xO_y$. Such actinide oxide materials are semiconductors, but may not be in the proper form from which to fabricate electronic devices. For example, the actinide oxide may be in a "raw" form. The raw actinide oxide material can be converted into a "refined" or electronic grade starting material, in single crystal or polycrystalline form.

For purposes of the present application, the terms "semiconductive actinide oxide," "actinide oxide semiconductor" or "actinide oxide semiconductor material" may be used to refer to any actinide oxide material having semiconductive properties, whether in raw or refined form. An actinide oxide semiconductor material which has the proper morphology to be used as an electronic grade starting material for the fabrication of electronic devices may be referred to as refined actinide oxide semiconductor material. The term "raw actinide oxide semiconductor" is used herein refer to semiconductive actinide oxides in the "raw" form, including $UO_2$, $PuO_2$, and $ThO_2$. Such raw actinide oxide materials have a semiconductive-range bandgap, and may therefore be used, after conversion to the refined form, as a semiconductor material in various applications.

Thus, in the present invention, raw, semiconductive actinide oxides are used to form refined or starting grade actinide oxide semiconductors, which may then be used in a variety of ways to fabricate various electronic devices.

Bandgap, typically measured in eV, is typically a function of the overlapping electron shells of various atoms arrayed in a structure. The electronic bandgap is the width of the forbidden region, where no allowed energy states exist in the semiconductor. The bandgaps of at least some actinide oxides, such as $UO_2$, $PuO_2$, and $ThO_2$, range from 0.48 eV to a few eV. In particular, the electronic bandgap (forbidden bandgap) indicates that depleted uranium (in the form of oxides) are semiconductive. Uranium oxide bandgaps range from 0.2 eV up to 5 eV (e.g., 1.3 eV at room temperature for $UO_2$).

Figure 2:
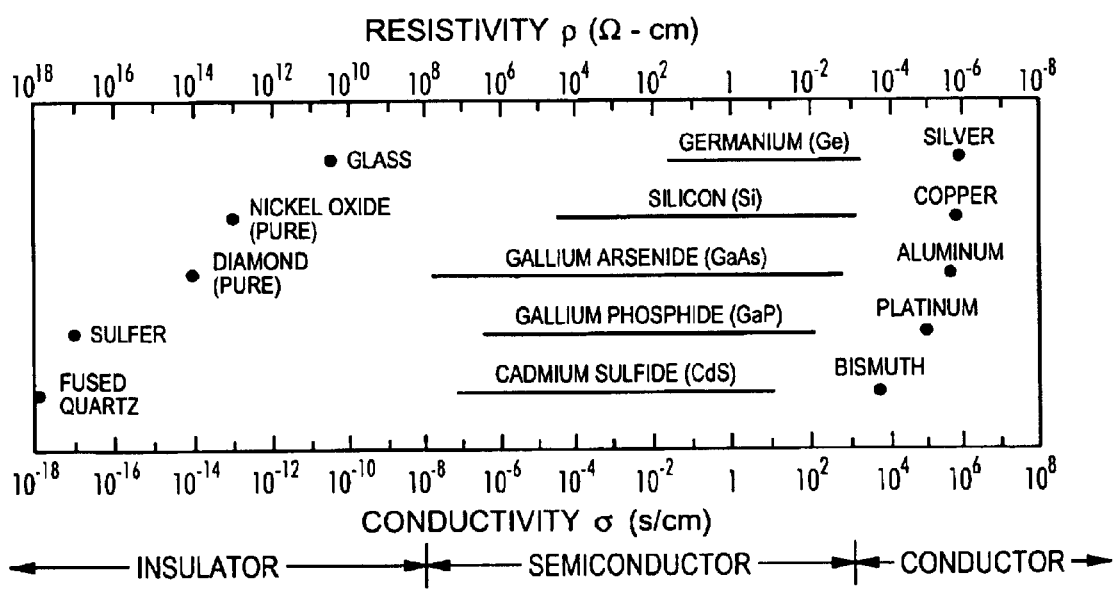
FIG. 2 is a diagram showing the typical range of conductivities for insulators, semiconductors, and conductors.

Referring now to FIG. 1, there is shown a graph of electrical conductivity of $UO_2$ single crystals as a function of temperature. At room temperature, the electrical conductivity of intrinsic $UO_2$ ($\sim 10^{-3} \Omega^{-1}$ cm$^{-1}$) is approximately the same as single crystal silicon and less than the intrinsic electrical conductivity of GaAs, as illustrated in the diagram of FIG. 2, which shows the typically range of conductivities for insulators, semiconductors, and conductors. This implies higher efficiency electronic devices.

Fabrication of Actinide Oxide Semiconductor Devices

As noted above, raw semiconductive actinide oxide material may be converted into electronic grade starting material in single crystal or polycrystalline form. The resulting refined actinide oxide semiconductor material may then be used to fabricate various devices, as described in further detail below. First, a refined actinide oxide semiconductor is formed. This may be done in a number of ways. For example, some nuclear processes leave, as a by-product, actinide oxide fuel pellets, which may contain, for example, raw actinide oxide material such as $UO_2$ encased in graphite. To form a refined actinide oxide semiconductor, the graphite coating on the pellet is stripped off by some suitable technique, and the remaining pellets ground up into powder and/or melted. From this may be formed a single crystal (or polycrystalline) ingot of semiconductor material, for example.

Alternatively, by-products of some processes may exist in liquid form, such as uranium hexafluoride ($UF_6$), and $U_3O_8$. These "depleted" uranium materials may be left over as a result of uranium enrichment processes, for example. For example, uranium may be melted in a cylinder to remove a specified isotope; the remaining depleted uranium material cools and hardens inside the cylinder. These uranium-based raw semiconductive actinide oxide materials may also be converted into electronic grade starting material in single crystal or polycrystalline form, as will be appreciated.

The ingot of refined actinide oxide semiconductor material may be sliced into individual wafers, which may be used as substrates to fabricate various electronic devices and components which may be converted into an actinide oxide material, and used to fabricate actinide oxide semiconductor-based electronic devices. For example, each wafer may have fabricated thereon a number of ICs, each on a respective die, which has a number of interconnected passive and active devices. Such wafers may be used to fabricate other devices, such as solar cells or thermoelectric devices, as described below.

As another alternative technique of using actinide oxide to form a useful, refined semiconductor material, the powder (raw) form of a semiconductive actinide oxide material can be plasma-sprayed onto a suitable substrate to form, e.g., a polycrystalline semiconductor layer or coating on the substrate. Such a plasma-sprayed polycrystalline semiconductor layer may have lower efficiency than a wafer from an ingot, but might have tolerable semiconductive and other characteristics for some applications and may be less expensive to manufacture. For example, such a technique may be used to form a solar cell, e.g. by plasma spraying both an n-type and a p-type layer.

Actinide Oxide Semiconductor-Fabricated Electronic Devices

Actinide oxide semiconductors can be used to form a variety of useful electronic devices, such as solar cells (both optical and IR), solid-state devices (such as ICs), or other devices made with semiconductor materials.

For example, using conventional fabrication technology, solar or photovoltaic cells can be fabricated with actinide oxide semiconductor materials such as $UO_2$, $U_3O_8$, and $U_2O_2$. From a consideration of the electronic bandgap of these materials, it can be seen that these materials can be made into a photovoltaic device that can convert optical and IR radiation into electrical energy. Various solar cell designs are feasible. Perhaps the easiest to fabricate is a Schottky-barrier solar cell which makes use of the different work functions of the oxide material and the metal or other contact which forms the diode. Referring now to FIG. 3, there is shown an exemplary electronic device 311 fabricated from an actinide oxide semiconductor material, according to a preferred embodiment of the present invention. Device 311 represents any electronic device fabricated from an actinide oxide semiconductor material, and may be, for example, an integrated circuit formed in wafer 310.

Solar cells made from such actinide oxide semiconductor materials may be able to operate at elevated temperatures with respect to conventional semiconductors, due to high-temperature stability. They may also have higher energy efficiency, and be radiation hardened (EMI resistant). For example, such photovoltaic cells may be more impervious to damage from radiation and EMP (electromagnetic pulse), able to operate at up to 2000° C. (as opposed to 200° C. for conventional semiconductor materials), and more efficient in converting IR radiation to electrical energy. At room temperature, the bandgap $E_g$ of $UO_2$ is ~1.3 eV, which is between that of Si and GaAs. This gives $UO_2$ the highest solar cell efficiency possible, i.e. it is at the peak point in the efficiency vs. $E_g$ curve.

Referring now to FIGS. 4A,B, there are illustrated solar cells 410, 450 fabricated using actinide oxide semiconductor materials. Solar cell 410 has a p-n junction, and solar cell 450 has a Schottky-barrier junction. Each solar cell 410, 450 contains an antireflection coating on the top surface, and a bottom ohmic contact (not shown). Light or EM radiation impinging on the top surface of each solar cell causes the cell to generate current and voltage, i.e. the light is converted into electrical energy. The solar cell is thus an energy conversion device. Either a p-n junction type solar cell 410, or a Schottky-barrier junction type solar cell 450 may be fabricated using actinide oxide semiconductor material, as follows.

First, there is provided an actinide oxide semiconductor material which is doped either with acceptor atoms (which would cause it to be p-type, and which would provide conductivity due to holes), or with donor atoms, such as phosphorus or arsenic (to provide n-type conductivity). For this purpose, an actinide oxide semiconductor material is selected that has an electron bandgap that is between about 0.48 eV and 5 eV. The optimum bandgap for the highest efficiency would be about 1.3 eV; there is some evidence to suggest that this is the approximate bandgap for $UO_2$.

Suppose an actinide oxide semiconductor material such as $UO_2$ is doped with n-type donor atoms. After it is doped, the doped $UO_2$ has associated with it a certain work function. The work function is a measure of the amount of energy necessary to remove an electron from the bottom of the conduction band (for n-type) or from the top of a valence band (for p-type), to a vacuum level or to an "infinite" distance from the material. I.e., the work function is the amount of energy necessary to ionize the atom, by removing the electron.

To form a solar cell, e.g. Schottky-barrier solar cell 450, the surface of the $UO_2$ needs to be coated with a metal that has a work function that is very different from that of the $UO_2$ itself. This may be done, e.g., by sputtering or evaporating the metal onto the surface. In general, the work functions of oxide materials are less than most of the metals, e.g. possibly 1 to 2 eV less. Thus, the surface may be coated with a material such as platinum, which has a work function of around 4.1 eV. Because this latter work function is larger than that of the $UO_2$, there is a difference, or barrier height. The barrier height is the energy barrier that the charge carrier (electrons for n-type material), have to overcome through thermonic emission processes for there to be current flow. If the work function of the deposited metal were the same as the work function of $UO_2$, there would not be any barrier height, and thus there would not be any rectifying action or any current or power generated.

In an embodiment, a thin layer of a metal such as platinum is coated onto the $UO_2$. The layer is preferably thin enough, e.g. 50 Å to 100 Å, so that it is effectively transparent to incident light. It is effectively transparent in that it allows a large fraction, such as 90% or more, of the incident light to pass through. Incident light passes through the platinum layer and into the $UO_2$, where it provides enough energy for some electrons to go into the conduction band from the donor sites (phosphorus or arsenic) and to then generate a current.

Such a solar cell has various operating characteristics, e.g. a short-circuit current density $J_{SC}$ (which can be measured by passing it through a known resistance), and open-circuit voltage $V_{OC}$. Other characteristics include overall cell efficiency. The product of $J_{SC}$ times the cross-sectional area of the cell (which yields the short circuit current), times the open circuit voltage $V_{OC}$, yields the maximum power available from such a Schottky-barrier solar cell 450.

As with all Schottky-barrier solar cells, because a thin metallic film is coated on top of the substrate, the solar cell works best if the substrate is a single crystal semiconductor material. Even if a polycrystalline semiconductor material is used to fabricate a Schottky-barrier solar cell, such a solar cell works well because it shorts out each of the small grain boundaries and so helps to improve the efficiency, as will be appreciated. By contrast, a polycrystalline p-n junction solar cell would be less efficient than a polycrystalline Schottky-barrier cell, because in this case there would be conduction across the grain boundaries, which result in a series resistance seen by the current.

Actinide oxides may also be used to form thermoelectric devices. The Seebeck coefficient for $UO_2$ is three times greater than the best thermoelectric material, $Bi_2Te_3$. The Seebeck coefficient is a measure of thermoelectric efficiency: the higher the value of the coefficient, the better. The Seebeck coefficients of $UO_2$ range from 30 to 850 $\mu$V/K. At room temperature (~300° K.), the Seebeck coefficient for $UO_2$ is ~750 $\mu$V/K, which is superior to the currently most promising materials (TST and TGT, ~270 $\mu$V/K). When a junction is made between a semiconductive actinide oxide such as $UO_2$, and a material such as $Bi_2Te_3$ (i.e., a thermoelectric material), a hybrid solar-thermoelectric cell will likely result. The heat from the depleted uranium oxide material will establish a thermal gradient across the $Bi_2Te_3$. Then, via the Seebeck effect, an electric current will be generated. When optical and IR radiation is incident upon the oxide material, current and carriers will be generated which would cause electric current to flow across the oxide-$Bi_2Te_3$ interface. Thus, depleted uranium oxide, and other actinide oxides, may be used as a thermoelectric material (e.g., for next-generation small-scale refrigeration and power generation applications).

Actinide oxides may also be used to fabricate ICs. For example, actinide oxide in powder form can be melted and grown as single crystals, in the form of an ingot. The ingot is then sliced into wafers, used as substrates. The single-crystal semiconductor wafer can then be processed using conventional IC processing techniques to form active and passive components. For example, the wafer is doped to modify the electrical conductivity to provide extrinsic properties. Such ICs may exhibit much higher device densities than achievable with conventional semiconductor materials such as Si and GaAs.

Actinide oxides may also be used to fabricate ionic or mixed conductors, which can be used, for example, as electrodes and solid electrolytes for battery or fuel cell applications for a battery or fuel cell.

In an alternative embodiment, an actinide oxide semiconductor material may comprise a mixture or combination of two or more semiconductive actinide oxides.

ICs and other electronic devices fabricated using actinide oxides may also be able to withstand and operate in higher temperatures than conventional Si/GaAs-based electronic devices. For example, current semiconductor materials such as Si or GaAs can only be used under limited temperature conditions (less than 473° K.). Uranium oxide-based materials (such as $U_3O_8$ or $UO_2$) actually perform better at higher temperatures (~2600° K.), and are more stable (longer life time) than conventional semiconductors.

In addition, uranium oxides have a much higher dielectric constant than conventional electronic materials. The dielectric constant for uranium oxide, for example, is 22 at room temperature, as compared with 12 for Si and 14 for GaAs. A higher dielectric constant enables fabrication of uranium oxide-based electronic devices, such as ICs, at much higher density than possible in silicon-based fabrication, without suffering CMOS tunneling breakdown due to smaller (nanometer) feature sizes. Thus, uranium oxide-based electronics should offer better performance than Si or GaAs.

Conventional electronics, e.g. silicon-based, are sensitive to radiation, and susceptible to radiation damage. As noted above with reference to photovoltaic cells fabricated from actinide oxide semiconductor materials, electronic devices fabricated with uranium-based actinide oxide semiconductors should be more resistant to a radiation or EMI environment, because oxide materials are generally more resistant to radiation than is silicon. This can help the electronic devices fabricated with actinide oxide material better withstand the harsh EMP environment such as in a confined package design or in outer space.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A method for fabricating solar cells, comprising:
   a. providing an actinide oxide semiconductor oxide selected from the group consisting of uranium and plutonium; and
   b. fabricating a solar cell using the actinide oxide semiconductor material.

2. The method of claim 1, wherein the actinide oxide semiconductor material is selected from the group consisting of $UO_2$ and $U_3O_8$.

3. The method of claim 1, wherein actinide oxide semiconductor material comprises a mixture of two or more semiconductive actinide oxides.

4. The method of claim 1, wherein the solar cell is a Schottky-barrier solar cell.

5. The method of claim 1, wherein step (b) comprises the step of radiation-hardening the solar cell.

6. The method of claim 1, wherein the solar cell is one of an optical and an IR solar cell.

7. An electronic device fabricated in accordance with the method of claim 1.

8. A method of fabricating a solar cell comprising:
   a. providing a raw semiconductive actinide oxide as a by-product of a nuclear energy process;
   b. forming refined actinide oxide semiconductor material from the raw semiconductive actinide oxide; and
   c. fabricating a solar cell using said refined actinide oxide semiconductor material.

9. A method for fabricating a thermoelectric device comprising:
   a. providing $UO_2$; and
   b. using the $UO_2$ to fabricate a thermoelectric device comprising a junction between the $UO_2$ portion and a $Bi_2Te_3$ thermoelectric material, wherein a thermal gradient across the junction will generate an electric current via the Seebeck effect.

10. A method of fabricating an electronic device comprising:
    a. providing depleted uranium raw semiconductive actinide oxide formed as a by product of uranium enrichment;
    b. converting the raw semiconductive actinide oxide into an ingot of refined actinide oxide material;
    c. slicing the ingot into a plurality of wafers; and
    d. fabricating an electronic device using one of the wafers.

11. The method of claim 10 wherein the refined actinide oxide material is one of single and polycrystalline form.

12. A method of fabricating an electronic device comprising:
    a. providing actinide oxide fuel pellets comprising raw $UO_2$ encased in a graphite coating;
    b. stripping the graphite coating off the raw $UO_2$;
    c. grinding the raw $UO_2$ into a powder;
    d. converting the powder form of raw $UO_2$ into an ingot;
    e. slicing the ingot into an plurality of wafers; and
    f. fabricating an electronic device using one of the wafers.

13. The method of claim 12 wherein the refined actinide oxide material is one of single and polycrystalline form.

* * * * *